United States Patent
Sekiya et al.

(10) Patent No.: US 7,482,786 B2
(45) Date of Patent: Jan. 27, 2009

(54) ELECTRIC DISCHARGER USING SEMICONDUCTOR SWITCH

(75) Inventors: Takayuki Sekiya, Nagoya (JP); Shoji Tange, Nagoya (JP); Takeshi Sakuma, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 409 days.

(21) Appl. No.: 11/293,324

(22) Filed: Dec. 5, 2005

(65) Prior Publication Data
US 2006/0120113 A1    Jun. 8, 2006

(30) Foreign Application Priority Data
Dec. 7, 2004    (JP)    .............................. 2004-354486

(51) Int. Cl.
*H01M 10/46*    (2006.01)
(52) U.S. Cl. ..................................... 320/166
(58) Field of Classification Search ................. 320/128, 320/134, 135, 136, 140, 166
See application file for complete search history.

(56) References Cited

U.S. PATENT DOCUMENTS

| | | |
|---|---|---|
| 3,176,158 A | 3/1965 | Guignard |
| 3,367,314 A | 2/1968 | Hirowasa et al. |
| 3,485,227 A | 12/1969 | Meyerle |
| 3,510,676 A | 5/1970 | Pierce |
| 3,671,761 A | 6/1972 | Shibuya et al. |
| 3,877,864 A | 4/1975 | Carlson |
| 4,028,559 A | 6/1977 | Larner |
| 4,740,722 A | 4/1988 | Furuhata |
| 5,151,762 A | 9/1992 | Uenishi et al. |
| 5,514,918 A | 5/1996 | Inatomi et al. |
| 5,530,617 A | 6/1996 | Bonavia et al. |
| 5,627,741 A | 5/1997 | Naruo et al. |
| 5,774,348 A | 6/1998 | Druce et al. |
| 6,608,768 B2 | 8/2003 | Sula |
| 6,879,062 B2 | 4/2005 | Oates |
| 7,084,528 B2 | 8/2006 | Hatano et al. |

(Continued)

FOREIGN PATENT DOCUMENTS

EP    0 959 562 A1    11/1999

(Continued)

OTHER PUBLICATIONS

U.S. Appl. No. 11/447,377, filed Jun. 6, 2006 in the name of Tatsuhiko Hatano et al.

(Continued)

*Primary Examiner*—Edward Tso
(74) *Attorney, Agent, or Firm*—Oliff & Berridge, PLC

(57) ABSTRACT

An electric discharger includes: an inductor, a first semiconductor switch, and a second semiconductor switch which are connected in series between opposite terminals of a DC power supply unit; and a reactor connected to output terminals of the inductor. Induced energy is stored in the inductor when the first semiconductor switch is turned on. The inductor generates a high voltage when the first semiconductor switch is turned off. The reactor is discharged under the high voltage. The reactor has a pair of electrodes, a dielectric body and a space, the dielectric body and the space being disposed between the electrodes. The first semiconductor switch is turned on again when charging of the dielectric body of the reactor under the high voltage is substantially finished.

6 Claims, 10 Drawing Sheets

U.S. PATENT DOCUMENTS

| | | |
|---|---|---|
| 2003/0209993 A1 | 11/2003 | Ito et al. |
| 2003/0230938 A1 | 12/2003 | Hatano et al. |

FOREIGN PATENT DOCUMENTS

| | | |
|---|---|---|
| EP | 1 376 868 A2 | 1/2004 |
| GB | 2 105 927 A | 3/1983 |
| JP | A 08-223915 | 8/1996 |
| JP | B 2649340 | 5/1997 |
| JP | A 10-76182 | 3/1998 |
| JP | A 11-145793 | 5/1999 |
| JP | A 2002-44965 | 2/2002 |
| JP | A 2003-272887 | 9/2003 |
| JP | A 2003-338648 | 11/2003 |
| JP | A 2004-72994 | 3/2004 |

OTHER PUBLICATIONS

U.S. Appl. No. 10/579,557, filed May 16, 2006 in the name of Tatsuhiko Hatano et al.

U.S. Appl. No. 11/405,698, filed Apr. 18, 2006 in the name of Tatsuhiko Hatano et al.

Namihira et al.; "Improvement of NOx Removal Efficiency Using Short-Width Pulsed Power"; IEEE Transaction on Plasmic Science, vol. 28., No. 2, Apr. 2000; pp. 434-442.

Ichikawa et al.; "Deposition of a-Si : H based film by high voltage pulse discharge CVD"; Oyo Buturi; 1992; vol. 6, No. 10; pp. 1039-1043.

Iida et al., "Ultra Short-width High-Voltage Pulse Generator," NGK Insulators, Ltd., Lecture No. PST-02-16, no date.

Jiang et al., "Compact, high repetition-rate pulsed power generator using high-speed Si-thyristor," Conference Record of the 25th International Power Modulator Symposium and 2002 High-Voltage Workshop, Jul. 30-Jul. 3, 2002, IEEE, pp. 602-604 {Jun. 30, 2002}.

Yamashita et al., "High rep-rate inductive-energy-storage pulsed power modulator using high voltage static induction thyristor," Conference Record of the 25th International Power Modulator Symposium and 2002 High-Voltage Workshop, Jun. 30-Jul. 3, 2002, IEEE, pp. 382-385 {Jun. 30, 2002}.

Bowles et al., "30 kA, 5000 V Solid State Opening Switch for Inductive Energy Stores," Proceedings of the Power Modulator Symposium, Jun. 23-25, 1992, IEEE, vol. Symp. 20, pp. 249-253 {Jun. 23, 1992}.

FIG. 2A

Sc   OFF | ON | OFF | ON | OFF
TIME

FIG. 2B

I1
TIME

FIG. 2C

I2
TIME

FIG. 2D

Vo
TIME

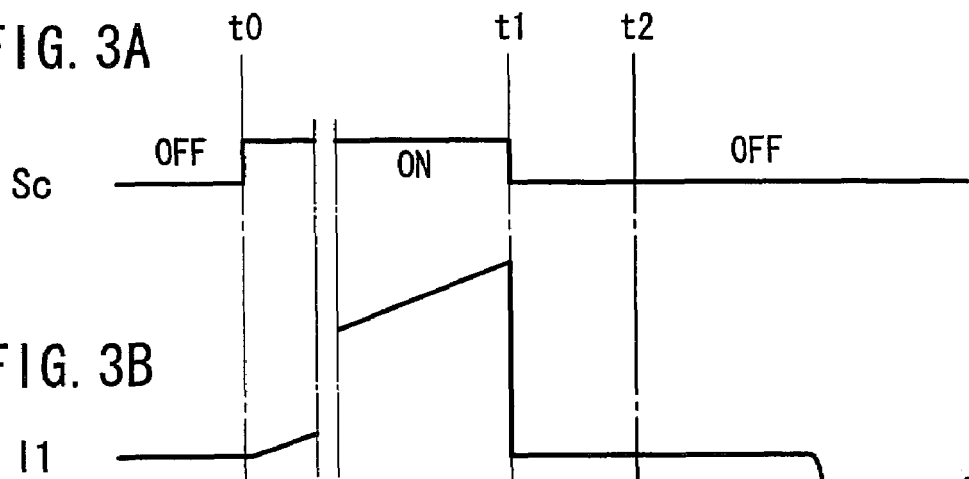
FIG. 3A Sc
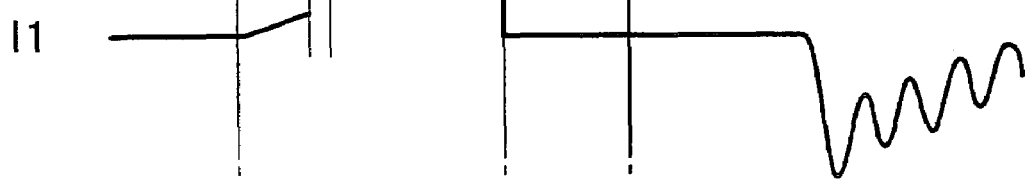
FIG. 3B I1
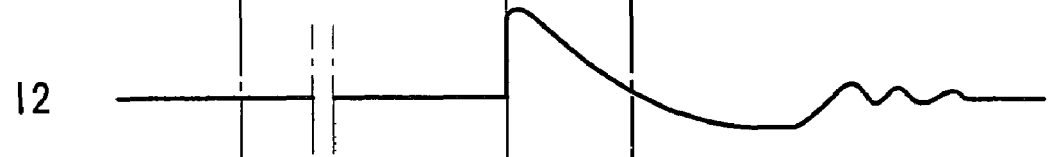
FIG. 3C I2
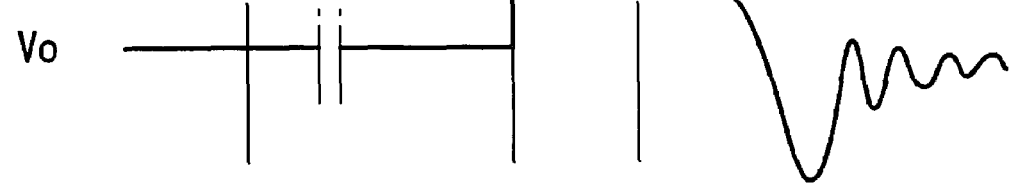
FIG. 3D Vo

ELECTRIC DISCHARGER USING SEMICONDUCTOR SWITCH

BACKGROUND OF THE INVENTION

1. Field of the Invention

The present invention relates to an electric discharger of a simple circuit arrangement for causing a reactor having a dielectric body to discharge by releasing an electromagnetic energy stored in an inductor from a DC power supply unit under a low voltage.

2. Description of the Related Art

Technologies for deodorization, sterilization, and toxic gas decomposition based on a plasma developed by high-voltage pulse discharges have recently been put to use. To generate such a plasma, a high-voltage pulse generating circuit capable of supplying extremely narrow pulses of a high voltage is required.

There has heretofore been proposed a high-voltage pulse generating circuit as disclosed in Japanese Laid-Open Patent Publication No. 2004-72994, for example. As shown in FIG. 6, the proposed high-voltage pulse generating circuit, generally denoted by 200, has a simple circuit arrangement including a transformer 204, a first semiconductor switch 206, and a second semiconductor switch 208 which are connected in series across a DC power supply unit 202. The first semiconductor switch 206 has an anode connected to an end of a primary winding of the transformer 204, whose other end is connected to a cathode of a diode 210. The diode 210 has an anode connected to the gate terminal of the first semiconductor switch 206.

When the second semiconductor switch 208 is turned on, the first semiconductor switch 206 is rendered conductive, applying a voltage from the DC power supply unit 202 to the primary winding of the transformer 204, storing induced energy in the transformer 204. When the second semiconductor switch 208 is thereafter turned off, since the first semiconductor switch 206 is quickly turned off, developing a sharply rising extremely narrow high-voltage pulse Po across the secondary winding of the transformer 204. Therefore, a high voltage Vo appears between output terminals 212, 214 of the secondary winding of the transformer 204.

The high-voltage pulse generating circuit 200 is capable of supplying the high voltage Vo which has a sharp rising time and an extremely short pulse duration without the need for a plurality of semiconductor switches to which a high voltage is applied.

A reactor may be connected between the output terminals 212, 214 of the high-voltage pulse generating circuit 200 for producing an electric discharge. Silent electric discharges are advantageous in that they can develop a stable nonequilibrium plasma without causing an arc discharge, and pose little limitations on the waveform of the applied voltage. A reactor for producing silent electric discharges may have a pair of electrodes with a dielectric body and a space interposed therebetween. The dielectric body may be of alumina.

An electric discharge produced by a reactor which has a dielectric body and a space interposed between a pair of electrodes will be described below with reference to FIGS. 7 through 10D.

As shown in FIGS. 7 and 8, a reactor 300 has two upper and lower alumina plates 302, 304, which jointly serve as a dielectric body 305, support plates 308 disposed between the upper and lower alumina plates 302, 304 to keep a space 306 as a constant gap between the upper and lower alumina plates 302, 304, an upper electrode 310 disposed on an upper surface of the upper alumina plate 302, and a lower electrode 312 (see FIG. 8) disposed on a lower surface of the lower alumina plate 304.

An equivalent circuit of the reactor 300 is shown in FIG. 9. As shown in FIG. 9, the equivalent circuit has a first capacitance Cc1 of the dielectric body 305 provided by the upper and lower alumina plates 302, 304 and a second capacitance Cc2 of the space 306, the first capacitance Cc1 and the second capacitance Cc2 being connected in series with each other.

A voltage (spatial discharge voltage Vc2) applied across the space 306 is unknown. However, it can be determined from the voltage (output voltage Vo) applied to the reactor 300 in its entirety and the voltage (voltage Vc1 to charge the dielectric body 305) applied across the first capacitance Cc1 according to the following equation:

$$Vc2 = Vo - Vc1$$

The voltage Vc1 to charge the dielectric body 305 is expressed as follows:

$$Vc1 = Q/Cc1 = (1/Cc1) \times \int Ic\, dt,$$

where Q represents electric charge and Ic represents an electric current flowing through the reactor 300.

As shown in FIG. 9, the reactor 300 is connected between the output terminals 212, 214 of the high-voltage pulse generating circuit 200. The high-voltage pulse generating circuit 200 is normally operated as described above. After the first semiconductor switch 206 is turned off, the voltage (output voltage Vo) applied across the reactor 300 has a waveform including a forward peak voltage Vp1 and then a reverse peak voltage Vp2, as shown in FIG. 10A. The voltage applied across the dielectric body 305, i.e., the voltage Vc1 to charge the dielectric body 305, has a waveform including a forward peak voltage Vp in synchronism with the forward peak voltage Vp1 included in the waveform of the output voltage Vo, as shown in FIG. 10C.

As shown in FIG. 10D, the discharge voltage Vc2 across the space 306 is clamped to a certain positive voltage Va1 in the period of the forward output voltage Vo and then to a certain negative voltage Va2 in the period of the reverse output voltage Vo, as can be plotted based on the above equation.

As shown in FIG. 9, the space 306 in the reactor 300 is represented by an equivalent circuit comprising a series-connected circuit 316 of two zener diodes 314a, 314b having respective anode terminals connected to each other, and the second capacitance Cc2 connected parallel to the series-connected circuit 316.

The voltage (output voltage Vo) applied across the reactor 300 etc. will be described below with reference to FIGS. 10A through 10D.

When the second semiconductor switch 208 is turned on, the first semiconductor switch 206 is rendered conductive. An electric current flows through the inductance of the transformer 204, storing induced energy in the transformer 204. When the second semiconductor switch 208 is subsequently turned off at time t10, the electric current that has flowed through the inductance of the transformer 204 flows into the reactor 300.

In this initial stage, an electric current Ic flows into the second capacitance Cc2 of the space 306 in the reactor 300, charging the second capacitance Cc2 (see the broken line P in FIG. 9). When the discharge voltage is reached, the voltage applied across the space 306 is clamped to the forward discharge voltage Va1 (see FIG. 10D), and the electric current Ic flows through the series-connected circuit 316 (see the broken line Q in FIG. 9). At this time, the dielectric body 305 quickly starts being charged, storing energy.

At time t11 when the current Ic flowing in the reactor 300 becomes zero, the dielectric body 305 stops being charged, and the energy stored in the dielectric body 305 is consumed by being discharged.

Thereafter, the electric current Ic flows backwards into the electrostatic capacitance Cc2 of the space 306, charging the electrostatic capacitance Cc2 (see the broken line R in FIG. 9). When the discharge voltage is reached, the voltage applied across the space 306 is clamped to the reverse discharge voltage Va2 (see FIG. 10D), and the electric current Ic flows through the series-connected circuit 316 (see the broken line S in FIG. 9). At this time, part of the energy remaining in the dielectric body 305 is consumed by being discharged. The energy that has not been consumed by the reactor 300 flows back to the DC power supply unit 202 (see FIG. 6).

The reactor 300, which has the upper and lower electrodes 310, 312 and the dielectric body 305, i.e., the upper and lower alumina plates 302, 304, and the space 306 interposed between the upper and lower electrodes 310, 312, has difficulty increasing pulse energy per cycle, for example. Specifically, when the first semiconductor switch 206 is turned off, the electric current flowing through the inductance of the transformer 204 flows into the reactor 300, storing a large amount of energy in the dielectric body 305. The stored energy is partly consumed by the subsequent reverse discharge, and the energy which remains unconsumed flows back to the DC power supply unit 202. As a result, though the DC power supply unit 202 undergoes a large burden, no commensurate energy can be applied to the reactor 300. Stated otherwise, though the DC power supply unit 202 undergoes a large burden, the amount of energy that is consumed by the reactor 300 is small.

SUMMARY OF THE INVENTION

The present invention has been made in view of the above problems and it is an object of the present invention to provide an electric discharger which is of a simple circuit arrangement for increasing an amount of energy to be applied to a reactor.

An electric discharger according to the present invention includes an inductor and at least one semiconductor switch which are connected in series between opposite terminals of a DC power supply unit, and a reactor connected to output terminals of the inductor. Induced energy is stored in the inductor when the semiconductor switch is turned on. The inductor generates a high voltage when the semiconductor switch is turned off. The reactor is discharged under the high voltage. The reactor has a pair of electrodes, a dielectric body and a space, the dielectric body and the space being disposed between the electrodes. The semiconductor switch is turned on again when charging of the dielectric body of the reactor under the high voltage is substantially finished.

According to the present invention, the semiconductor switch may be turned on again when an electric current flowing through the dielectric body of the reactor under the high voltage becomes substantially zero.

According to the present invention, the semiconductor switch may be turned on again when a voltage applied across the reactor under the high voltage reaches a substantially peak value.

When the semiconductor switch is turned on, an electric current flows through the inductor, storing induced energy therein. Thereafter, when the semiconductor switch is turned off, the electric current that has flowed through the inductor flows into the reactor.

In an initial stage, the electrostatic capacity of the space in the reactor is charged. When the discharge voltage is reached, the voltage applied across the space is clamped to a forward discharge voltage. At this time, the dielectric body quickly starts being charged, storing energy.

When the electric current flowing through the reactor becomes zero, the dielectric body stops being charged, and part of the energy stored in the dielectric body is consumed by being discharged. At this time, the voltage applied across the reactor under the high voltages reaches a substantially peak value.

When the semiconductor is turned on (re-ignited) at this time, the sum of a voltage ΔV due to the energy remaining in the dielectric body and the high voltage that appears across the inductor when the semiconductor switch is turned on is applied across the space in the reactor. In the initial stage, the electrostatic capacity of the space in the reactor is charged. When the discharge voltage is reached, the voltage applied across the space is clamped to a reverse discharge voltage. At this time, the energy in the dielectric body is consumed almost in its entirety by being discharged. Therefore, the energy generated by an electric discharge caused when the high voltage is applied across the reactor is greater than if the semiconductor is not re-ignited.

According to the present invention, therefore, the energy applied to the reactor can be increased by a simple circuit arrangement.

The electric discharger of the above construction may further include a second semiconductor switch connected in series with the inductor and the semiconductor switch between the opposite terminals of the DC power supply unit. The induced energy is stored in the inductor as the semiconductor switch is rendered conductive when the second semiconductor switch is turned on. The inductor generates a high-voltage pulse as the semiconductor switch is turned off when the second semiconductor switch is turned off. The semiconductor switch is turned on again when the second semiconductor switch is turned on again.

The electric discharger may further include a control circuit for controlling turning-on and turning-off of the semiconductor switch.

According to the present invention, as described above, the electric discharger is capable of increasing the energy applied to the reactor with a simple circuit arrangement.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIGS. 2A through 2D are diagrams showing waveforms of a control signal, an electric current flowing through a primary winding of a transformer, an electric current flowing through a reactor, and an output voltage in the electric discharger according to the embodiment;

FIGS. 3A through 3D are diagrams showing waveforms of a control signal, an electric current flowing through a primary winding of a transformer, an electric current flowing through a reactor, and an output voltage in a comparative example;

DESCRIPTION OF THE PREFERRED EMBODIMENT

An electric discharger according to an embodiment of the present invention will be described below with reference to FIGS. 1 through 5.

Figure 1:
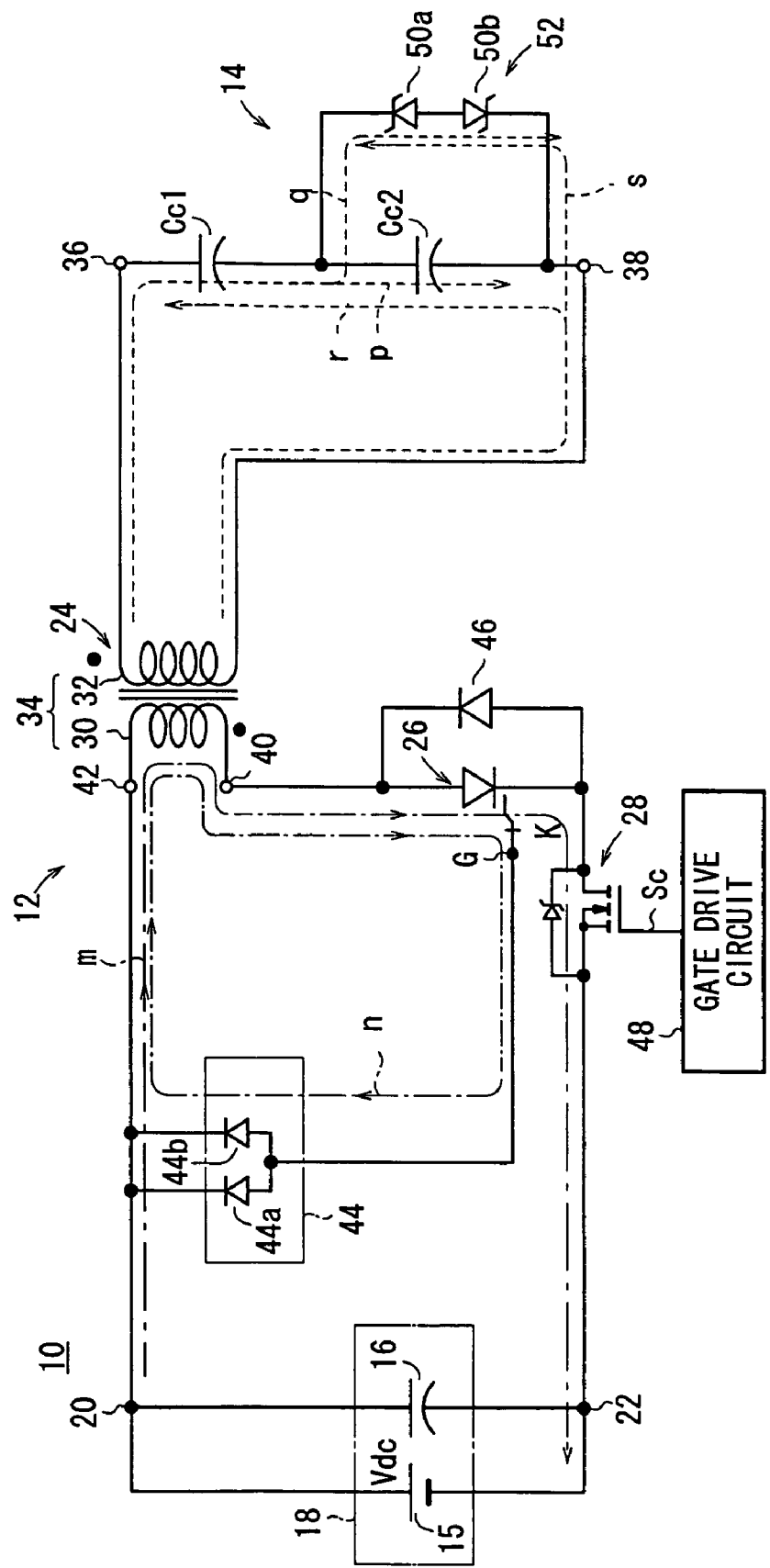
FIG. 1 is a circuit diagram of an electric discharger according to an embodiment of the present invention.

As shown in FIG. 1, an electric discharger 10 according to the embodiment of the present invention has a high-voltage pulse generating circuit 12 and a reactor 14.

The high-voltage pulse generating circuit 12 comprises a DC power supply unit 18 having a DC power supply 15 (power supply voltage Vdc) and a capacitor 16 for lowering a high-frequency impedance, and an inductor 24, a first semiconductor switch 26, and a second semiconductor switch 28 that are connected in series between output terminals 20, 22 of the DC power supply unit 18.

The inductor 24 includes a transformer 34 having a primary winding 30 and a secondary winding 32. The transformer 34 produces a high voltage between output terminals 36, 38 of the secondary winding 32 thereof. The reactor 14 is connected between the output terminals 36, 38 of the secondary winding 32. The primary winding 30 has a terminal 40 connected to an anode terminal of the first semiconductor switch 26.

A diode unit 44 is connected between a gate terminal G of the first semiconductor switch 26 and the other terminal 42 of the primary winding 30 of the transformer 34. The diode unit 44 has two parallel diodes 44a, 44b having respective anode terminals connected to the gate terminal G of the first semiconductor switch 26.

The first semiconductor switch 26 is shunted by a diode 46. The diode 46 has an anode terminal and a cathode terminal that are connected respectively to the cathode terminal and the anode terminal of the first semiconductor switch 26. Therefore, the diode 46 is held in anti-parallel connection to the first semiconductor switch 26.

In FIG. 1, the second semiconductor switch 28 is connected to the negative terminal 22 of the DC power supply unit 18. However, the second semiconductor switch 28 may be connected to the positive terminal 20 of the DC power supply unit 18. An output voltage of the high-voltage pulse generating circuit 12 may be extracted from both ends of the first semiconductor switch 26, rather than the inductor 24.

The second semiconductor switch 28 may comprise a self-extinguishing or commutation-extinguishing device. In the illustrated embodiment, the second semiconductor switch 28 comprises a power metal oxide semiconductor field-effect transistor incorporating avalanche diodes held in anti-parallel connection. A gate drive circuit 48 supplies a control signal Sc between the gate and source terminals of the second semiconductor switch 28.

The first semiconductor switch 26 may comprise a current-controlled device or a self-extinguishing or commutation-extinguishing device. In the illustrated embodiment, the first semiconductor switch 26 comprises an SI thyristor that is highly resistant to a voltage increasing ratio (dv/dt) when it is turned off and has a high voltage rating.

Figure 7:
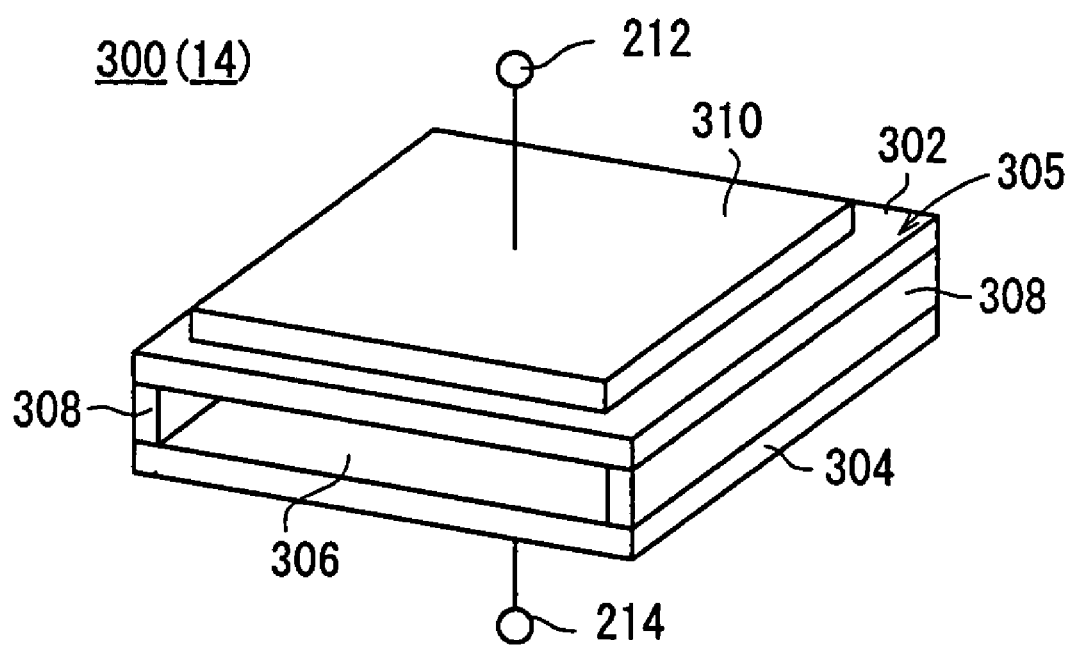
FIG. 7 is a perspective view of a general reactor used for silent electric discharges.
Figure 8:
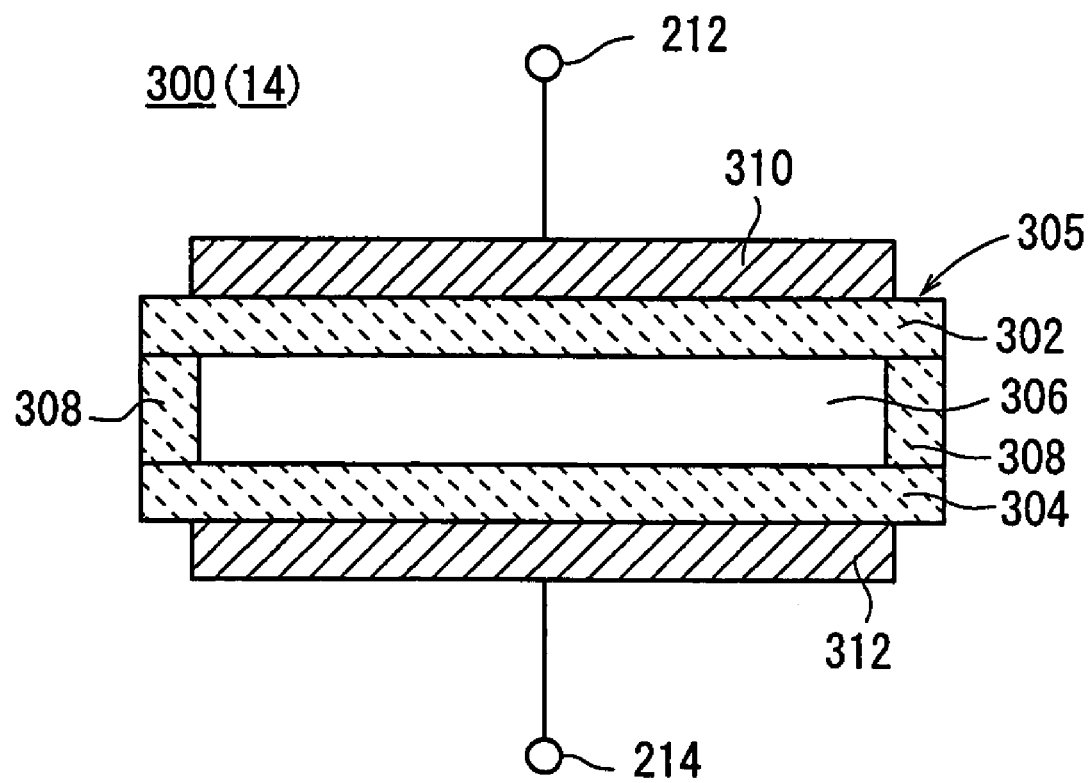
FIG. 8 is a vertical cross-sectional view of the general reactor used for silent electric discharges.
Figure 9:
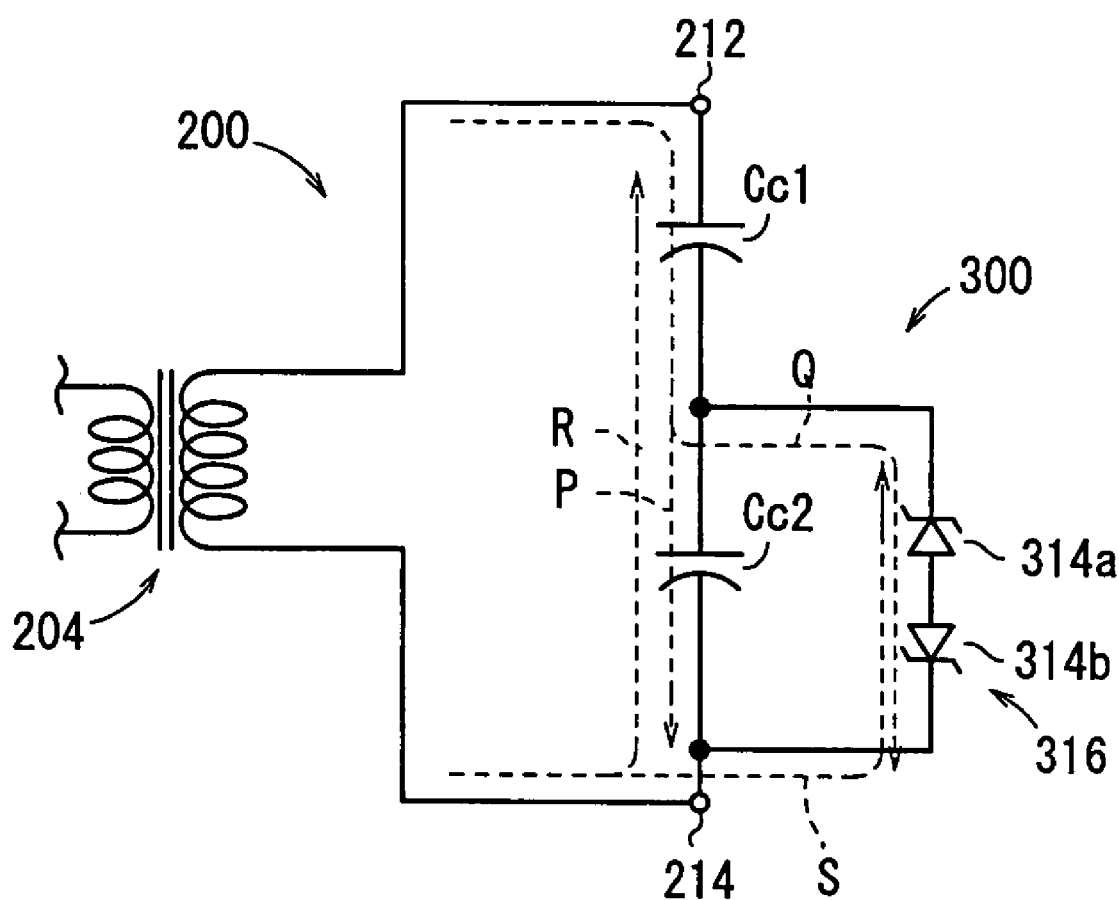
FIG. 9 is a circuit diagram showing an equivalent circuit of a reactor that is connected between output terminals of a high-voltage pulse generating circuit.
Figure 10A:
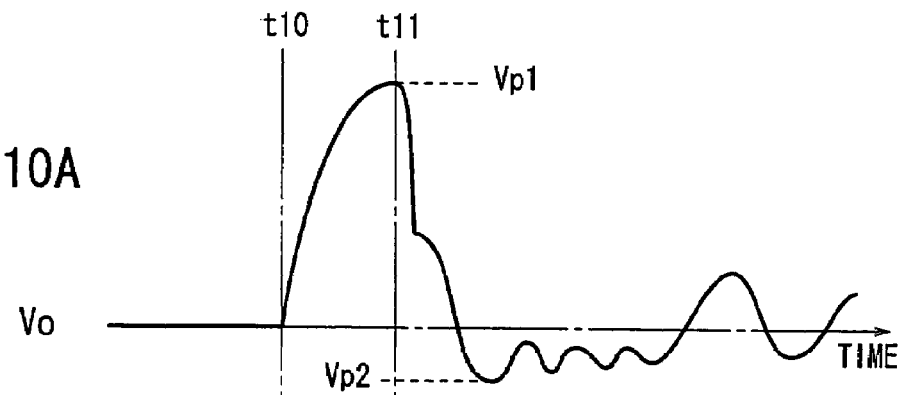
FIGS. 10A through 10D are diagrams showing waveforms of an output voltage of the conventional high-voltage pulse generating circuit with the reactor connected between the output terminals thereof, an electric current flowing through the reactor, a voltage applied across a dielectric body, and a voltage applied across a space.
Figure 10B:
Figure 10C:
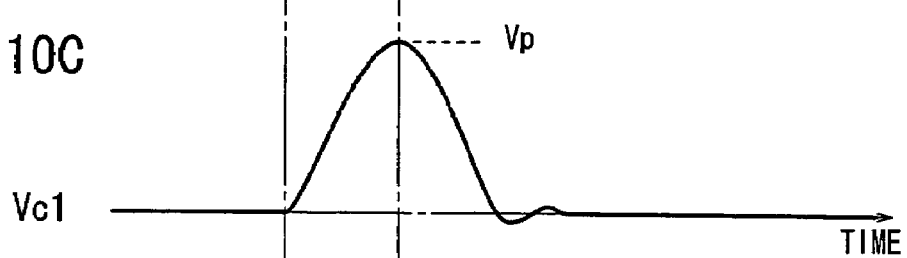
Figure 10D:
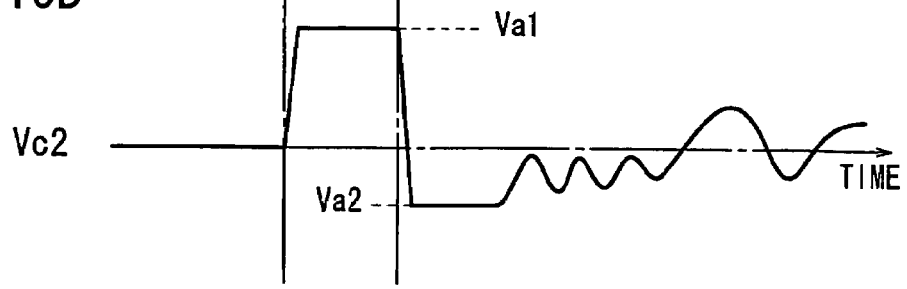

The reactor 14 is connected between output terminals 36, 38 of the transformer 34 of the high-voltage pulse generating circuit 12. The reactor 14 is structurally identical to the reactor 300 shown in FIGS. 7 and 8. Specifically, as shown in FIGS. 7 and 8, the reactor 14 has a dielectric body 305 comprising two upper and lower alumina plates 302, 304, support plates 308 disposed between the upper and lower alumina plates 302, 304 to keep a space 306 as a constant gap between the upper and lower alumina plates 302, 304, an upper electrode 310 disposed on an upper surface of the upper alumina plate 302, and a lower electrode 312 disposed on a lower surface of the lower alumina plate 304.

As shown in FIG. 1, the reactor 14 has an equivalent circuit having a first capacitance Cc1 of the dielectric body 305 provided by the upper and lower alumina plates 302, 304 and a second capacitance Cc2 of the space 306, the first capacitance Cc1 and the second capacitance Cc2 being connected in series with each other. A series-connected circuit 52 of two zener diodes 50a, 50b having respective anode terminals connected to each other is connected parallel to the second capacitance Cc2.

Operation of the electric discharger 10 according to the embodiment will be described below with reference to the circuit diagram in FIG. 1 and the waveforms in FIGS. 2A through 2D.

At time t0, the control signal Sc supplied between the gate and source terminals of the second semiconductor switch 28 goes high, turning on the second semiconductor switch 28. Because of the extremely high opposite-polarity impedance of the diodes 44a, 44b of the diode unit 44, the first semiconductor switch 26 is turned on by a field effect positively applied between the gate and cathode terminals of the first semiconductor switch 26. Since an anode current of the first semiconductor switch 26 is prevented from rising by the inductor 24, the first semiconductor switch 26 is normally turned on solely by the field effect.

When the second semiconductor switch 28 and the first semiconductor switch 26 are turned on at time t0, a voltage which is the same as the voltage Vdc of the DC power supply 15 is applied to the transformer 34. If the primary inductance of the transformer 34 is represented by L, then an electric current I1 (see the dot-and-dash line m in FIG. 1) flowing through the primary winding 30 of the transformer 34 linearly increases at a gradient (V/L) with time.

Thereafter, at time t1, the control signal Sc supplied between the gate and source terminals of the second semiconductor switch 28 goes low, turning off the second semiconductor switch 28, and reducing the current from the cathode terminal of the first semiconductor switch 26 to zero, i.e., opening the first semiconductor switch 26. Therefore, the current I1 flowing through the primary winding 30 is cut off, and the primary winding 30 tends to generate a reverse induced voltage based on the remaining electromagnetic energy. Due to the diodes 44a, 44b, the current I1 that has flowed through the primary winding 30 flows circulatively through a path extending from the anode terminal of the first semiconductor switch 26 to the gate terminal G of the first semiconductor switch 26 to the anode terminals of the diodes 44a, 44b to the cathode terminals of the diodes 44a, 44b (see the dot-and-dash line n in FIG. 1). The current that has flowed through the inductance of the transformer 34 flows into the reactor 14, starting to generate an output voltage Vo between the terminals 36, 38 of the reactor 14. The output voltage Vo sharply rises due to an electromotive force induced by the transformer 34.

In an initial stage, an electric current I2 (see FIG. 2C and the broken line p in FIG. 1) flows through the second capacitance Cc2 of the space 306 of the reactor 14, charging the second capacitance Cc2. When the discharge voltage is reached, the voltage applied across the space 306 is clamped to the forward discharge voltage, and the electric current I2 flows through the series-connected circuit 52 (see the broken line q in FIG. 1). At this time, the dielectric body 305 (upper and lower alumina plates 302, 304) quickly starts being charged, storing energy.

When the current I2 flowing in the reactor 14 is reduced to zero, the dielectric body 305 stops being charged, and part of the energy stored in the dielectric body 305 is consumed by being discharged.

At time t2, the control signal Sc goes high (see FIG. 2A), turning on the second semiconductor switch 28 and then turning on the first semiconductor switch 26. At this time, the electric current I1 (see FIG. 2B and the dot-and-dash line m in FIG. 1) flows sharply through the primary winding 30 of the transformer 34, applying a voltage $\Delta V + n \times Vdc$ (where $\Delta V$ represents the voltage due to the energy remaining in the dielectric body, n represents the turns ratio of the transformer 34, i.e., the number n2 of turns in the secondary winding 32/the number n1 of turns in the primary winding 30, and Vdc represents the power supply voltage of the DC power supply unit 18) across the space 306 in the reactor 14, so that a sharp reverse current flows in the reactor 14 (see FIG. 2C). As shown in FIG. 2D, the output voltage Vo sharply drops in level. No electric discharge occurs through the inductance of the transformer 34, but the high voltage is instantaneously applied across the space 306 in the reactor 14, causing an electric discharge.

In the initial stage of the discharging process, a reverse current—I2 flows through the second capacitance Cc2 of the space 306, charging the second capacitance Cc2 (see the broken line r in FIG. 1). When the discharge voltage is reached, the voltage applied across the space 306 is clamped to the reverse discharge voltage, and the reverse electric current—I2 flows through the series-connected circuit 52 (see the broken line s in FIG. 1). When the voltage is thus clamped, the energy stored in the dielectric body 305 is consumed almost in its entirety.

With the electric discharger 10 according to the present embodiment, since almost all the energy remaining in the dielectric body 305 of the reactor 14 is consumed, the energy applied to the reactor 14 can be increased. As the energy applied to the reactor 14 can be increased by a simple process, i.e., the re-ignition of the first semiconductor switch 26, the electric discharger 10 is highly advantageous in terms of cost.

Operation of a comparative example wherein the second semiconductor switch 28 is not turned on at time t2 will be described below with reference to FIGS. 3A through 3D.

At time t1 prior to time t2, when the second semiconductor switch 28 is turned off, the current that has flowed through the inductance of the transformer 34 flows into the reactor 14, starting to generate an output voltage Vo between the terminals 36, 38 of the reactor 14, as shown in FIG. 3D. The output voltage Vo sharply rises due to an electromotive force induced by the transformer 34.

In the initial stage, the second capacitance Cc2 of the space 306 of the reactor 14 is charged. When the discharge voltage is reached, the voltage applied across the space 306 is clamped to the forward discharge voltage. At this time, the dielectric body 305 quickly starts being charged, storing energy.

When the first semiconductor switch 26 is turned off and the electric current I2 flowing through the reactor 14 is reduced to zero, the dielectric body 305 stops being charged, and part of the energy remaining in the dielectric body 305 is consumed by being discharged.

Thereafter, the electric current I2 flows in a reverse direction, charging the second capacitance Cc2 of the space 306 of the reactor 14. When the discharge voltage is reached, the voltage applied across the space 306 is clamped to the reverse discharge voltage. Since the discharging of the reverse electric current—I2 simply applies the voltage $\Delta V$ due to the energy remaining in the dielectric body 305 across the space 306, the reverse electric current—I2 flows slowly as shown in FIG. 3C, and the output voltage Vo drops slowly as shown in FIG. 3D. Though the energy remaining in the dielectric body 305 is consumed, because the reverse electric current flows, a considerable amount of energy is stored again in the inductance of the transformer 34 through the secondary winding 32 thereof. This energy is recovered to the DC power supply unit 18. Since the energy recovering process causes a circuit loss, excessive energy recovery leads to an efficiency reduction. Particularly, if the energy that is initially stored in the transformer 34 is large, then the charging voltage $\Delta V$ applied to the dielectric body 305 increases, so that the reverse electric current—I2 (negative electric current) increases. Thus, the amount of energy stored again in the transformer 34 increases (which is proportional to $0.5 \times (I22)^2$ where I22 represents the inductance of the transformer 34 on the side of the secondary winding 32). As a result, the energy recovered to the DC power supply unit 18 increases, making it difficult to increase the amount of energy applied to the reactor 14.

Figure 4:
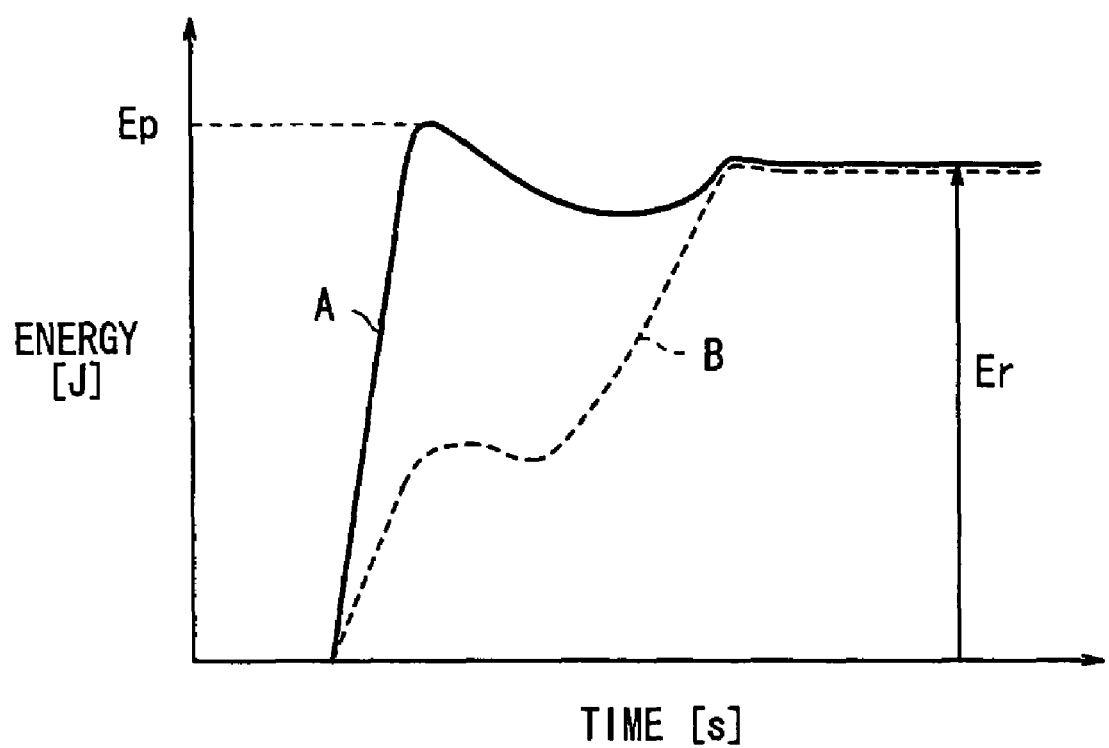
FIG. 4 is a diagram showing waveforms of energy curves in the comparative example.

FIG. 4 shows a chronological curve (energy curve A) representing energy calculated from the output voltage Vo of the reactor 14 and the electric current I2 flowing through the reactor 14 in the comparative example and a chronological curve (energy curve B) representing energy calculated from the voltage applied across the space 306 in the reactor 14 and the electric current I2 flowing through the reactor 14 in the comparative example.

According to the energy curves A, B, the energy recovered to the DC power supply unit 18 was large, and the energy Er consumed by the reactor 14 was greatly lower than a peak value Ep of the energy curve A, e.g., was 155.4 mJ.

Figure 5:
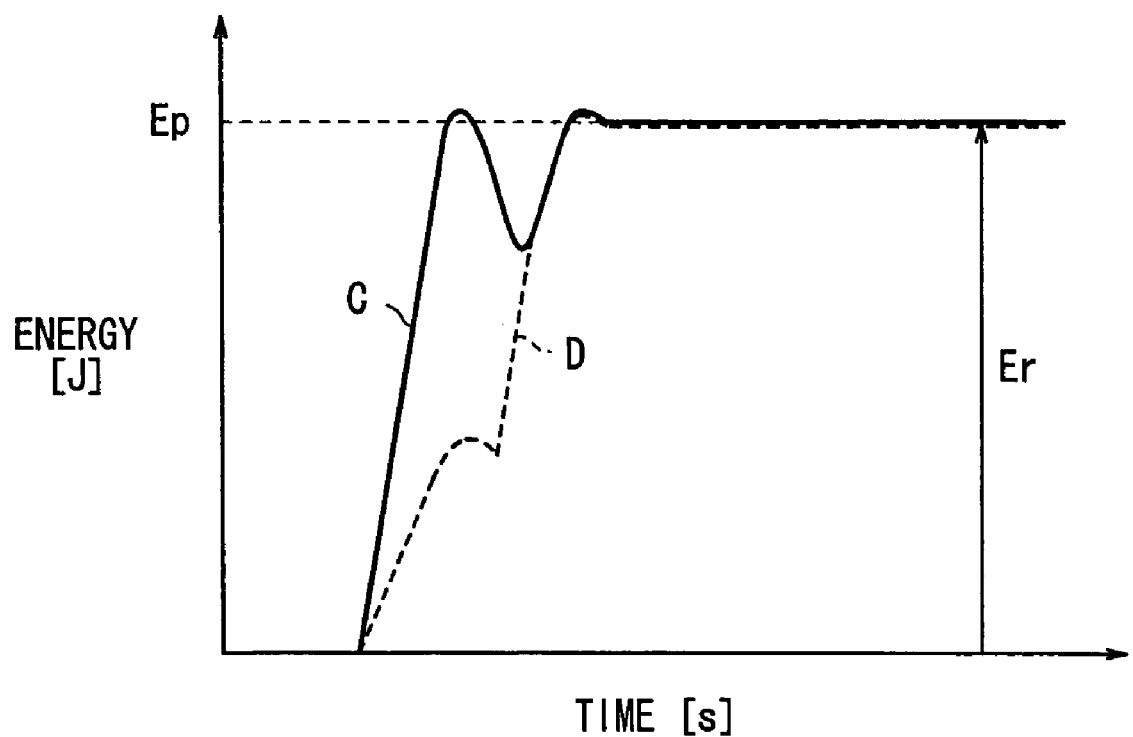
FIG. 5 is a diagram showing waveforms of energy curves in the electric discharger according to the embodiment.
Figure 6:
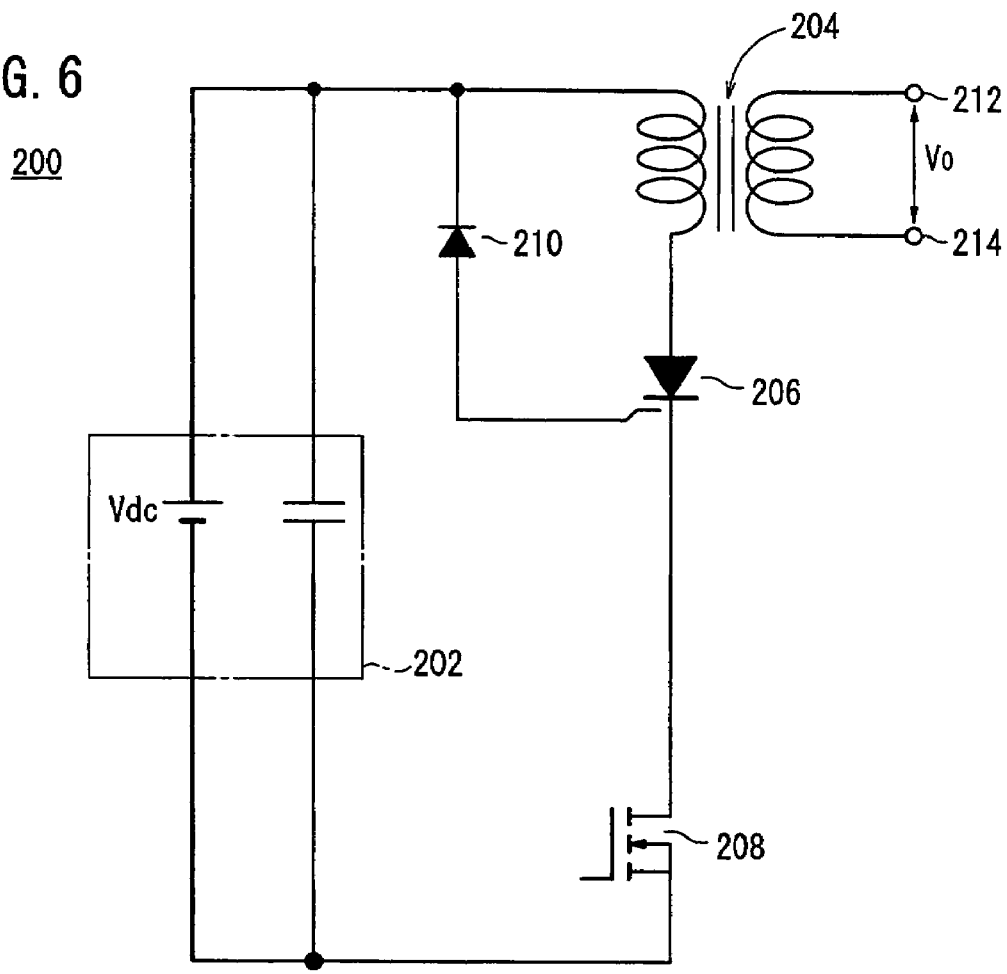
FIG. 6 is a circuit diagram of a conventional high-voltage pulse generating circuit in the comparative example.

FIG. 5 shows a chronological curve (energy curve C) representing energy calculated from the output voltage Vo of the reactor 14 and the electric current I2 flowing through the reactor 14 in the electric discharger 10 according to the embodiment and a chronological curve (energy curve D) representing energy calculated from the voltage applied across the space 306 in the reactor 14 and the electric current I2 flowing through the reactor 14 in the electric discharger 10 according to the embodiment.

With the electric discharger 10 according to the embodiment, since the applied energy is not recovered to the DC power supply unit 18, the energy Er consumed by the reactor 14 was of substantially the same level as the peak value Ep of the energy curve C, e.g., was 192.2 mJ.

It can be seen that the consumed energy (equivalent to the applied energy) per cycle of the electric discharger 10 according to the embodiment is about 23.7% greater than the consumed energy per cycle of the comparative example.

Although a certain preferred embodiment of the present invention has been shown and described in detail, it should be understood that various changes and modifications may be made therein without departing from the scope of the appended claims.

What is claimed is:

1. An electric discharger comprising:
    an inductor and at least one semiconductor switch which are connected in series between opposite terminals of a DC power supply unit;
    a reactor connected to output terminals of said inductor; and
    a control circuit for controlling turning-on and turning-off of said semiconductor switch,
    wherein induced energy is stored in said inductor when said semiconductor switch is turned on;
    said inductor generates a high voltage when said semiconductor switch is turned off;
    said reactor is discharged under said high voltage;
    said reactor has a pair of electrodes, a dielectric body and a space, said dielectric body and said space being disposed between said electrodes; and
    said control circuit turns on said semiconductor switch again when charging of said dielectric body of said reactor under said high voltage is substantially finished.

2. An electric discharger according to claim 1, further comprising:
    a second semiconductor switch connected in series with said inductor and said semiconductor switch between said opposite terminals of said DC power supply unit;
    wherein said control circuit controls turning-on and turning-off of said semiconductor switch by controlling turning-on and turning-off of said second semiconductor switch;
    the induced energy is stored in said inductor as said semiconductor switch is rendered conductive when said second semiconductor switch is turned on;
    said inductor generates a high-voltage pulse as said semiconductor switch is turned off when said second semiconductor switch is turned off; and
    said control circuit turns on said semiconductor switch again by turning on said second semiconductor switch again when charging of said dielectric body of said reactor under said high voltage is substantially finished.

3. An electric discharger comprising:
    an inductor and at least one semiconductor switch which are connected in series between opposite terminals of a DC power supply unit;
    a reactor connected to output terminals of said inductor; and
    a control circuit for controlling turning-on and turning-off of said semiconductor switch,
    wherein induced energy is stored in said inductor when said semiconductor switch is turned on;
    said inductor generates a high voltage when said semiconductor switch is turned off;
    said reactor is discharged under said high voltage;
    said reactor has a pair of electrodes, a dielectric body and a space, said dielectric body and said space being disposed between said electrodes; and
    said control circuit turns on said semiconductor switch again when an electric current flowing through said dielectric body of said reactor under said high voltage becomes substantially zero.

4. An electric discharger according to claim 3, further comprising:
    a second semiconductor switch connected in series with said inductor and said semiconductor switch between said opposite terminals of said DC power supply unit;
    wherein said control circuit controls turning-on and turning-off of said semiconductor switch by controlling turning-on and turning-off of said second semiconductor switch;
    the induced energy is stored in said inductor as said semiconductor switch is rendered conductive when said second semiconductor switch is turned on;
    said inductor generates a high-voltage pulse as said semiconductor switch is turned off when said second semiconductor switch is turned off; and
    said control circuit turns on said semiconductor switch again by turning on said second semiconductor switch again when an electric current flowing through said dielectric body of said reactor under said high voltage becomes substantially zero.

5. An electric discharger comprising:
    an inductor and at least one semiconductor switch which are connected in series between opposite terminals of a DC power supply unit;
    a reactor connected to output terminals of said inductor; and
    a control circuit for controlling turning-on and turning-off of said semiconductor switch,
    wherein induced energy is stored in said inductor when said semiconductor switch is turned on;
    said inductor generates a high voltage when said semiconductor switch is turned off;
    said reactor is discharged under said high voltage;
    said reactor has a pair of electrodes, a dielectric body and a space, said dielectric body and said space being disposed between said electrodes; and
    said control circuit turns on said semiconductor switch again when a voltage applied across said reactor under said high voltage substantially reaches a peak value.

6. An electric discharger according to claim 5, further comprising:
    a second semiconductor switch connected in series with said inductor and said semiconductor switch between said opposite terminals of said DC power supply unit;
    wherein said control circuit controls turning-on and turning-off of said semiconductor switch by controlling turning-on and turning-off of said second semiconductor switch;
    the induced energy is stored in said inductor as said semiconductor switch is rendered conductive when said second semiconductor switch is turned on;
    said inductor generates a high-voltage pulse as said semiconductor switch is turned off when said second semiconductor switch is turned off; and
    said control unit turns on said semiconductor switch again by turning on said second semiconductor switch again when a voltage applied across said reactor under said high voltage substantially reaches a peak value.

* * * * *